United States Patent

Mochida et al.

[11] Patent Number: 5,975,835
[45] Date of Patent: Nov. 2, 1999

[54] LEAD FRAME CONVEYING METHOD AND CONVEYING APPARATUS

[75] Inventors: Toru Mochida, Higashiyamato; Masayuki Seguro, Higashimurayama; Yoshimitsu Terakado, Hachioji; Shigeru Shiozawa, Musashimurayama, all of Japan

[73] Assignee: Kabushiki Kaisha Shinkawa, Tokyo, Japan

[21] Appl. No.: 08/919,666

[22] Filed: Aug. 28, 1997

[30] Foreign Application Priority Data

Aug. 29, 1996 [JP] Japan ................................. 8-247238

[51] Int. Cl.$^6$ ................................. B65G 49/00
[52] U.S. Cl. ........................... 414/751; 414/14; 414/806; 198/345.1
[58] Field of Search .................. 414/14, 17, 18, 414/19, 20, 750, 751, 222, 225, 786, 800, 806; 29/827, 740; 198/341.01, 341.02, 341.03, 345.1

[56] References Cited

U.S. PATENT DOCUMENTS

| | | |
|---|---|---|
| 4,010,840 | 3/1977 | Eberle ................................. 198/345.1 |
| 4,770,120 | 9/1988 | Kumatsu et al. . |
| 5,562,382 | 10/1996 | Miyoshi ................................. 414/222 |

FOREIGN PATENT DOCUMENTS

| | | |
|---|---|---|
| 63-56122 | 11/1988 | Japan . |
| 1-32127 | 6/1989 | Japan . |
| 2-4486 | 1/1990 | Japan . |
| 4-346446 | 12/1992 | Japan . |
| 5-275502 | 10/1993 | Japan . |

*Primary Examiner*—Donald W. Underwood
*Attorney, Agent, or Firm*—Koda & Androlia

[57] ABSTRACT

In a lead frame conveying method and apparatus used in, for instance, a wire bonding machine, a detection of the leading end of a lead frame supplied from a lead frame magazine and a positioning of the lead frame on a lead frame path are executed by a positioning sensor which is installed in the vicinity of a bonding position; and after the positioning, the lead frame is chucked by feeding claws so that a first bonding portion on the lead frame is conveyed by the feeding claws to the bonding position, thus avoiding use of the end surfaces of the feeding claws during the execution of positioning of the lead frame.

5 Claims, 6 Drawing Sheets

LEAD FRAME CONVEYING METHOD AND CONVEYING APPARATUS

BACKGROUND OF THE INVENTION

1. Field of the Invention

The present invention relates to a lead frame conveying method and conveying apparatus in which lead frames supplied from a loader side magazine are chucked and conveyed by the feeding claws of a frame feeder installed in a bonding apparatus such as a wire bonding apparatus, die bonding apparatus, etc.

2. Prior Art

Figure 3A:
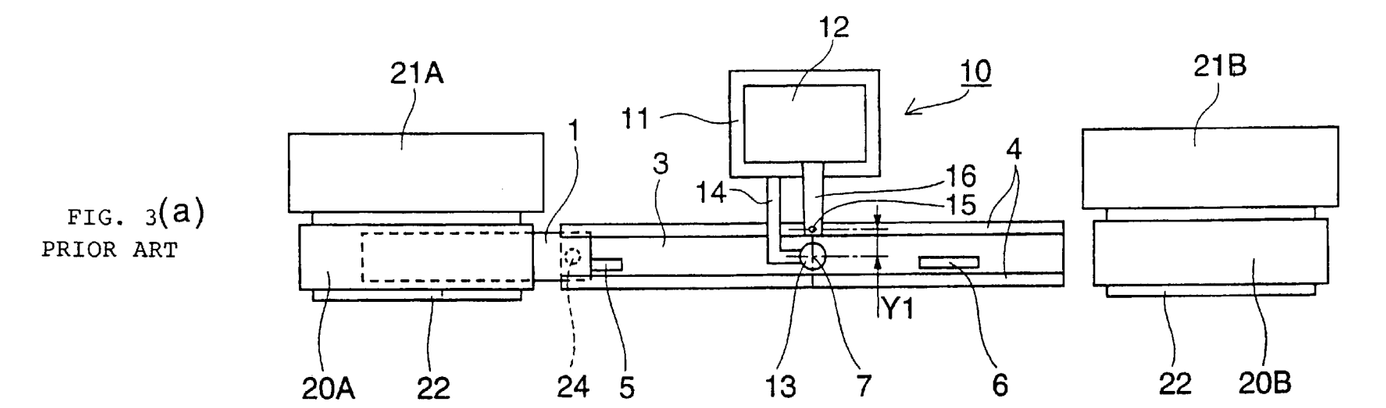
FIG. 3(a) is a plan view thereof.

FIG. 3 shows a conventional bonding apparatus A frame feeder 3 which conveys lead frames 1 includes guide rails 4 that are provided with guide grooves 4a for guiding the lead frames 1; and the feeder 3 further includes loader side feeding claws 5 and unloader side feeding claws 6.

The loader side feeding claws 5 consist of a pair of claws (an upper claw 5a and a lower claw 5b), and the unloader side feeding claws 6 consist of a pair of claws (an upper claw 6b and a lower claw 6b). Furthermore, the loader side and unloader side feeding claws 5 and 6 are opened and closed by a claw opening-and-closing means (not shown) and are moved along the guide rails 4 by a claw moving means (not shown).

Examples of frame feeders 3 of this type are disclosed in Japanese Patent Application Publication (Kokoku) No. 63-56122 and Japanese Patent Application Laid-Open (Kokai) No. 4-346446.

A bonding apparatus 10 such as a wire bonding apparatus, die bonding apparatus, etc., is installed so as to face the bonding position 7 which is located on one side of the guide rails 4 of the frame feeder 3. This bonding apparatus 10 has an XY table 11 which is driven in the X and Y directions; and a bonding head 12 is mounted on this XY table 11, and a camera holder 14 to which a television camera 13 is attached is fastened to this bonding head 12. Furthermore, a bonding arm 16 to which a bonding tool 15 is attached is installed on the bonding head 12 so that the bonding arm 16 can be raised and lowered. The television camera 13 is positioned above the bonding position 7, and the bonding tool 15 is provided so as to be offset from the television camera 13 by a distance of Y1. The bonding arm 16 is raised and lowered by a Z (vertical) driving motor (not shown).

The bonding apparatus described in Japanese Patent Application Kokai No. 5-275502 is an example of a bonding apparatus 10 of this type.

A loader side magazine 20A and an unloader side magazine 20B, which store lead frames therein, are installed at both ends of the guide rails 4. The loader side and unloader side magazines 20A and 20B are respectively positioned and carried on magazine holders 22 which are raised and lowered by a loader side elevator device 21A and an unloader side elevator device 21B. The lead frames 1 inside the loader side magazine 20A are pushed out into the guide grooves 4a of the guide rails 4 by a frame pusher 23.

Examples of systems equipped with elevator devices 21A and 21B of this type are disclosed in Japanese Patent Application Publication (Kokoku) Nos. S63-56122, H1-32127 and H2-4486.

In FIG. 3, the reference numeral 24 indicates a photo sensor which detects the lead frames 1 pushed out by the frame pusher 23.

An outline of the feeding operation of the above conventional frame feeder will be described with reference to FIG. 4.

A plurality of semiconductor chips (five chips in the shown embodiment, and which are hereafter referred to as "IC's") 2A through 2E are mounted on each of the lead frames 1A, 1B . . . shown in FIG. 4.

Figure 3B:
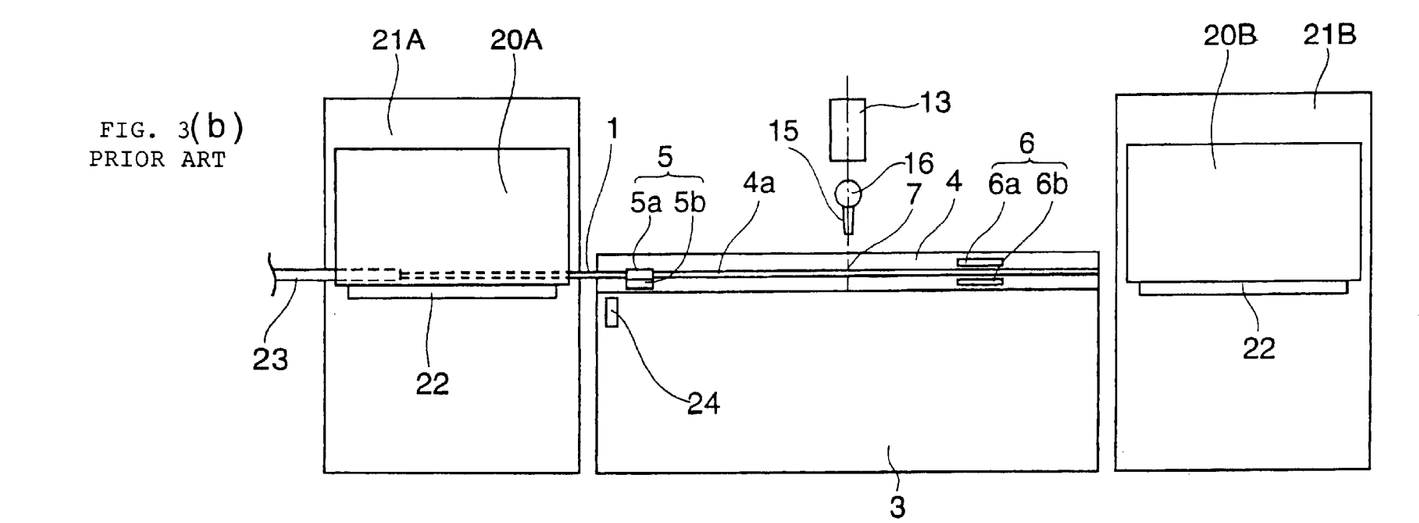
FIG. 3(b) is a front view thereof.
Figure 4A:
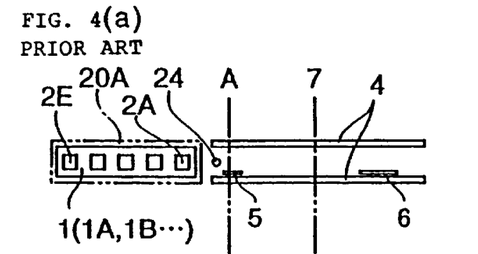
FIG. 4 is a process diagram which illustrates a conventional lead frame conveying method.

Beginning in the state shown in FIG. 4(a), the frame pusher 23 (see FIG. 3(b)) performs a push-out operation which pushes out the lead frame 1A at a low speed until the lead frame 1A is detected by the photo sensor 24. In this case, the loader side feeding claws 5 are in an open state, and the position where the loader side feeding claws 5 are located at this point is the feeding claw starting point A. When the photo sensor 24 detects the lead frame 1A, the low-speed push-out operation of the frame pusher 23 is ended.

Figures 4B, 4C, 4D, 4E:
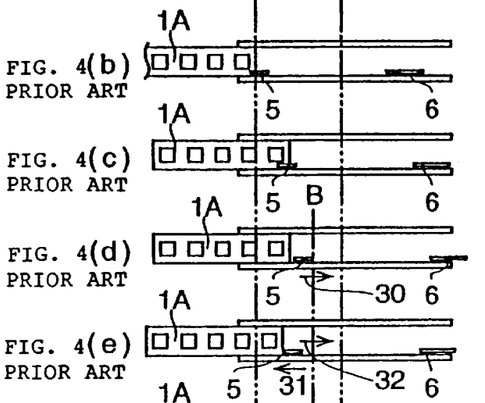

Next, the frame pusher 23 pushes the lead frame 1A out to the position shown in FIG. 4(b), where the lead frame 1A can be chucked by the loader side feeding claws 5. Then, the loader side feeding claws 5 close and chuck the lead frame 2A; and, as shown in FIG. 1(c), the loader side feeding claws 5 feed the lead frame 1A to a calculated initial alignment position in order to perform an initial alignment (positioning).

Then, an initial alignment operation (which will be described next) is performed. This initial alignment operation is, in the shown embodiment, performed by the frame feeder described in Japanese Patent Application Publication (Kokoku) No. S63-56122.

More specifically, the loader side feeding claws 5 open so as to release the lead frame 1A, and then the loader side feeding claws 5 move slightly in the direction of arrow 30 as shown in FIG. 4(d). At this time, the right-side ends of the loader side feeding claws 5 are positioned at point B.

Figures 4F, 4G, 4H, 4I:
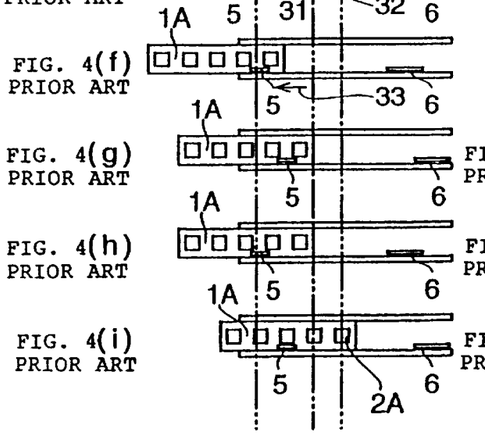

Next, after the loader side feeding claws 5 close, they are moved in the direction of arrow 31, so that the leading end of the lead frame 1A is pushed back by the loader side feeding claws 5, thus aligning the leading end of the lead frame 1A as shown in FIG. 4(e). Then, the loader side feeding claws 5 again move slightly in the direction of arrow 32 and Open so that the loader side feeding claws 5 will not interfere with the lead frame 1A. Afterward, the loader side feeding claws 5 move in the direction of arrow 33 and return to the feeding claw starting point A as shown in FIG. 4(f).

Figures 4J, 4K:
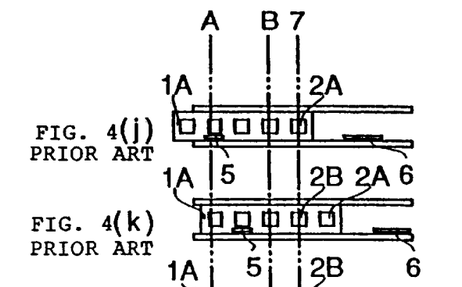

Next, a single-pitch feeding operation which feeds the lead frame 1A is performed. More specifically, the loader side feeding claws 5 close and chuck the lead frame 1A and then perform a feeding operation corresponding to one pitch as shown in FIG. 4(g). The loader side feeding claws 5 then open and return to the feeding claw starting point A as shown in FIG. 4(h); and then, the loader side feeding claws 5 close and chuck the lead frame 1A so as to perform a feeding operation until the first IC 2A on the lead frame 1A reaches the bonding position 7 as shown in FIG. 4(i). Following the completion of this feeding operation, the lead frame 1A is clamped by a window damper (not shown). In this state, the bonding points on the IC 2A are detected by the television camera 13 shown in FIG. 3, and bonding is performed on the corrected bonding points by the bonding tool 15 of the bonding apparatus 10. Meanwhile, the loader side feeding claws 5 return to the feeding claw starting point A as shown in FIG. 4(j).

Figures 4L, 4M, 4N:
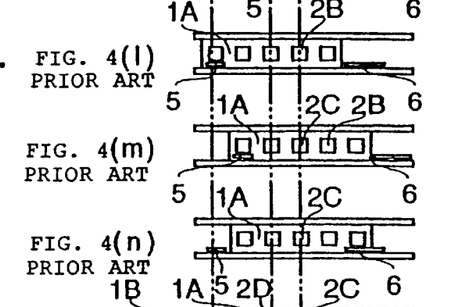

After bonding on the IC 2A is completed, the window damper opens; and an operation which feeds the IC 2B to the bonding position 7 is performed by the loader side feeding claws 5. More specifically, in the state shown in FIG. 4(j), the loader side feeding claws 5 close and chuck the lead frame 1A and then perform a feeding operation corresponding to one IC pitch as shown in FIG. 4(k). Afterward, the lead frame 1A is clamped by the window damper in the same fashion as described above, and bonding is performed on the IC 2B; and then, the unloader side feeding claws 5 return to the feeding claw starting point A in an open state as shown in FIG. 4(l). Next, a feeding operation similar to the feeding operation on the IC 2B is performed so that the IC 2C is fed to the bonding position 7 as shown in FIG. 4(m), and bonding is performed on the IC 2C by the same operation as that described above.

Although not mentioned above, the unloader side feeding claws 6 perform the same actions as the loader side feeding claws 5 when the loader side feeding claws 5 feed the lead frame 1A by opening and closing and performing reciprocating motions.

Figures 4O, 4P, 4Q:
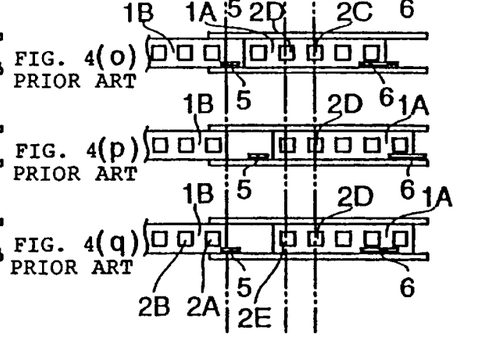

As shown in FIG. 4(n), the loader side feeding claws 5 being opened return to the feeding claw starting point A. At this point, the trailing end of the lead frame 1A is positioned on the bonding position 7 side of the feeding claw starting point A. In addition, the unloader side feeding claws 6 are opened so that these claws can chuck the lead frame 1A. While bonding is being performed on the IC 2C, the next lead frame 1B is fed to a position which allows the lead frame 1B to be chucked by the loader side feeding claws 5, as shown in FIG. 4(o). This operation is the same as the operation shown in FIGS. 4(a) and 4(b).

When bonding on the IC 2C is completed and the window damper opens, the unloader side feeding claws 6 close and chuck the lead frame 1A, so that the IC 2D on the lead frame 1A is fed to the bonding position 7 as shown in FIG. 4(p). In this case, since the trailing end of the lead frame 1A has not passed point B, no feeding of the lead frame 1B is performed by the loader side feeding claws 5. This feeding of the lead frame 1B is delayed in order to prevent the lead frame 1B from interfering with the preceding lead frame 1A. In other words, the loader side feeding claws 5 perform a reciprocating movement while in an open state. Once the trailing end of the lead frame 1A has passed point B, conveying of the lead frame 1B becomes possible; and the operation shown in FIG. 4(b) and subsequent steps are performed on the lead frame 1B. As shown in FIG. 4(q), the unloader side feeding claws 6 return to the starting point of the feeding claws 6 in an open state; and when the bonding on the IC 2D is completed, the unloader side feeding claws 6 perform an operation which feeds the IC 2E to the bonding position 7. Subsequently, the IC's 2A, 2B . . . of the lead frame 1B are successively fed to the bonding position 7, and bonding operations are performed on each IC.

Thus, the leading end surface of each lead frame 1 supplied from the loader side magazine 20A is pushed by the end surfaces of the loader side feeding claws 5 so that the lead frame 1 is positioned (aligned). Afterward, the lead frame is conveyed to the bonding position with the loader side feeding claws 5 changing their grip on the lead frame 1 several times by opening and closing.

Figure 5:
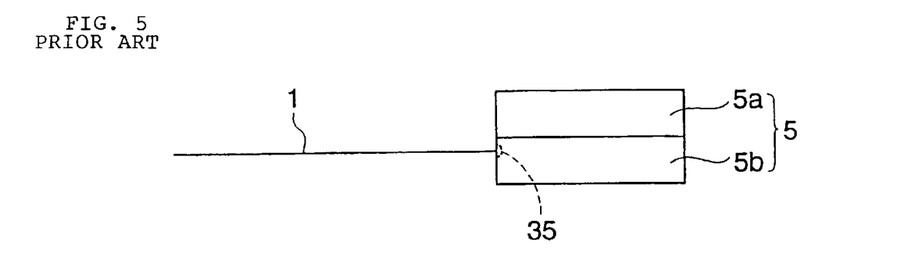
FIG. 5 is an explanatory diagram which illustrates the positioning of lead frames by the loader side feeding claws of the prior art.

In the method described above, the positioning of the lead frames 1 is accomplished by pushing the lead frames 1 with the end surfaces of the loader side feeding claws 5, a long-term use wears out the loader side feeding claws 5 as at 35 in FIG. 5, generating a positional discrepancy during positioning.

Figure 6A:
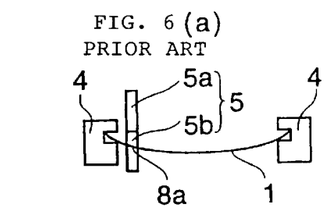
FIGS. 6(a) through 6(d) show conditions under which the position of the lead frame that contacts the end surfaces of the loader side feeding claws becomes uncertain in the prior art.
Figure 6B:
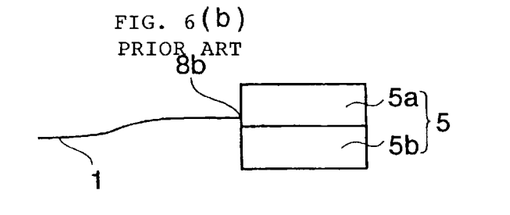
Figure 6C:
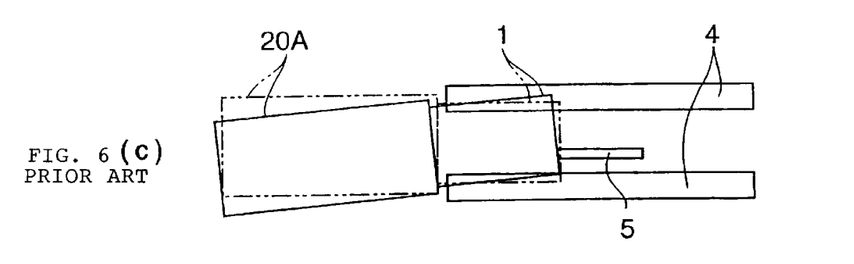

Furthermore, wide lead frames 1 tend to sag as shown in FIG. 6(a); dimensional errors between individual loader side magazines 20A and looseness between the loader side magazine 20A and the magazine holder holding the loader side magazine 20A cause the lead frames 1 to deform as shown in FIG. 6(c); and looseness of the guide rails 4 in the direction of width and differences in the width adjustment of the guide rails 4 cause the lead frames to deform. Because of these problems, the lead frames 1 may contact the end surfaces 8a or 8b of the loader side feeding claws 5 as shown in FIGS. 6(a) and 6(b), and it becomes uncertain exactly where the lead frames 1 will contact the end surfaces of the loader slide feeding claws 5; and as a result, positional discrepancies are generated during the positioning of the lead frames 1.

Figure 6D:
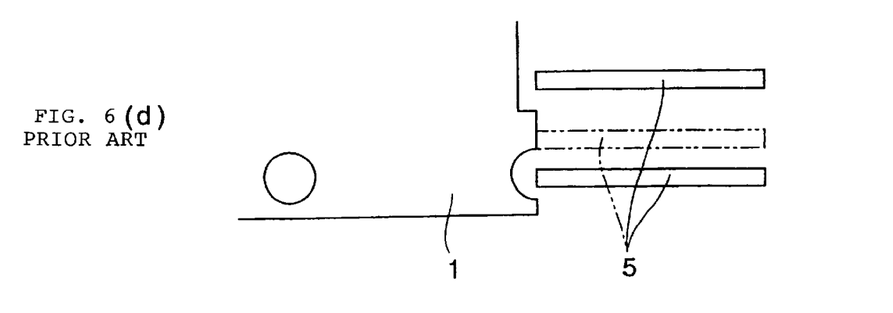

In addition, as shown in FIG. 6(d), since the portion of the end surface of each lead frame 1 contacted by the end surfaces of the loader side feeding claws 5 may be uncertain, depending on the shape of the end surface of the lead frame 1, positional discrepancies are likely to be generated.

In FIGS. 6(c) and 6(d), the two-dot chain lines indicate normal conditions, while the solid lines indicate abnormal conditions.

Figure 7A:
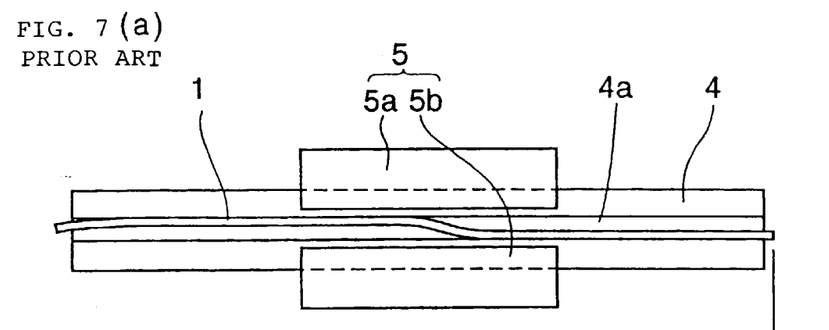
Figure 7B:
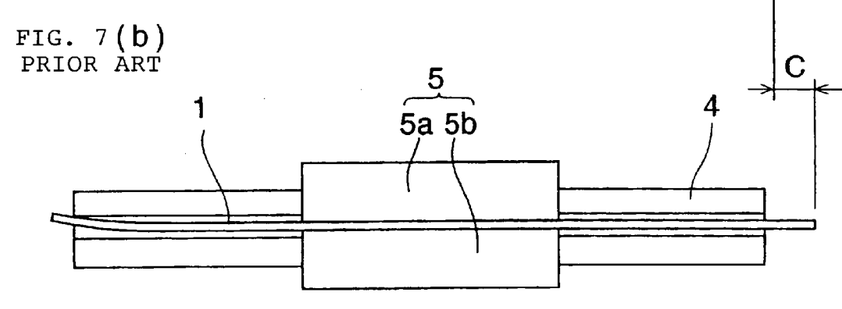
FIG. 7(b) is an explanatory diagram showing the state after the closing of the loader side feeding claws.

Furthermore, after each lead frame 1 has been positioned, the lead frame 1 is conveyed to the bonding position 7 while being repeatedly gripped by the loader side feeding claws 5. As result, because of deformation of the lead frame 1 as described above with reference to FIG. 6, as well as deformation of the lead frame 1 caused by the heat of the heater which heats the lead frame 1, and deformation of the lead frame 1 caused by expansion, etc., a positional discrepancy C as shown in FIG. 7(b) is generated in the leading end of the lead frame 1 each time the lead frame 1 is gripped by the loader side feeding claws 5, if the loader side feeding claws 5 are closed under conditions such as those shown in FIG. 7(a). As a result, a lead frame feeding discrepancy is generated while the lead frame 1 is being conveyed to the bonding position 7.

SUMMARY OF THE INVENTION

Accordingly, the primary object of the present invention is to provide a lead frame conveying method and apparatus in which wear of the loader side feeding claws can be prevented so that no lead frame positional discrepancy occurs even in the case of long-term use.

The secondary object of the present invention is to provide a lead frame conveying method and apparatus which causes no lead frame positional discrepancy even if there is some looseness, etc. in the loader side magazine or guide rails, etc. and which causes no discrepancy in the feeding of the lead frames to the bonding position even if there is some lead frame positional discrepancy resulting from repeated gripping by the loader side feeding claws or deformation caused by the heat of the heater.

The objects of the present invention are accomplished by a unique lead frame conveying method in which each of the lead frames supplied from a loader side magazine is chucked and conveyed by the feeding claws of a frame feeder, wherein a lead frame is chucked by the feeding claws in the vicinity of a bonding position; the leading end of the lead frame is detected by a positioning sensor, which is installed between the bonding position and the loader side magazine, so as to accomplish the positioning of the lead frame; and then following this positioning, the initial bonding portion of the lead frame is conveyed or transferred to the bonding position while the lead frame is chucked by the feeding claws.

Furthermore, the objects of the present invention are accomplished by a unique structure for a lead frame conveying apparatus in which lead frames supplied from a loader side magazine are chucked and conveyed by the feeding claws of a frame feeder, and the apparatus comprises: a positioning sensor installed between said loader side magazine and a bonding position so as to render the feeding claws to chuck the lead frame and perform a positioning of the lead frame; and a control means which conveys an initial bonding portion of the lead frame to the bonding position while the lead frame is chucked by the feeding claws after the leading end of the lead frame has been detected by the positioning sensor and the positioning of the lead frame has been completed.

BRIEF DESCRIPTION OF THE DRAWINGS

FIG. 1 illustrates one embodiment of the lead frame conveying apparatus of the present invention, in which

FIG. 3 schematically illustrates the construction of a conventional lead frame conveying apparatus, in which

FIG. 7 illustrates a lead form positional discrepancy caused by deformation of the lead frame in the prior art, in which FIG. 7(a) is an explanatory diagram showing the state prior to the closing of the loader side feeding claws, while

DETAILED DESCRIPTION OF THE INVENTION

One embodiment of the present invention will be described with reference to FIGS. 1 and 2. Elements which are the same as or correspond to those in FIG. 3 are labeled with the same or corresponding symbols, and a description thereof is omitted.

Figure 1A:
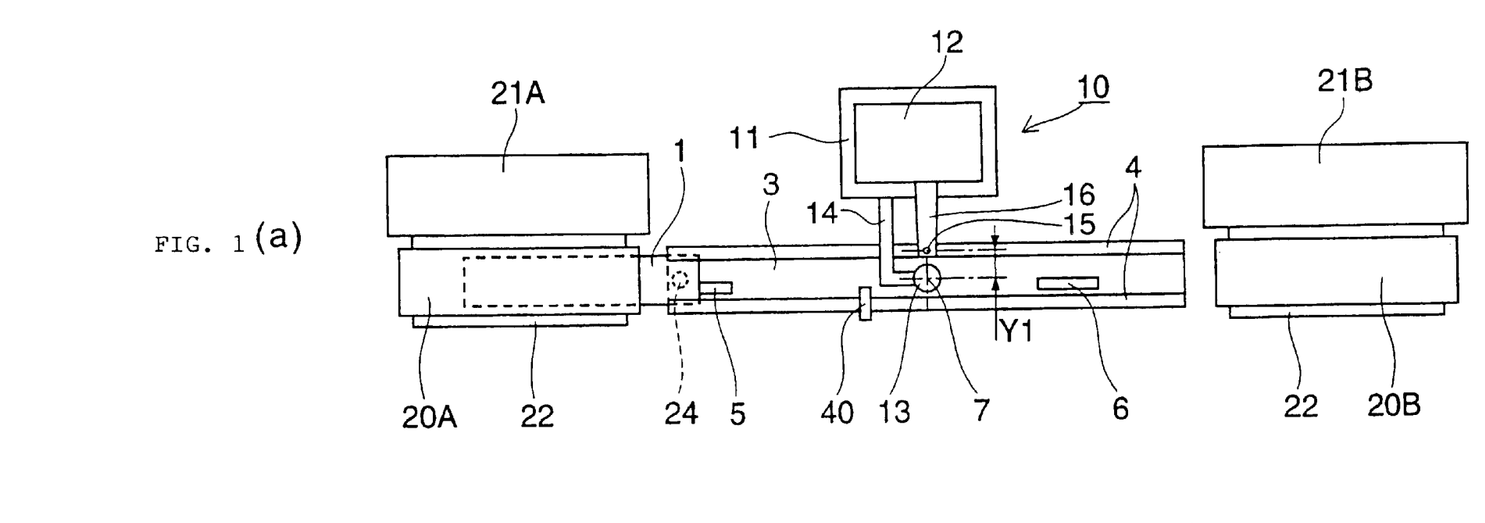
FIG. 1(a) is a schematic plan view thereof.
Figure 1B:
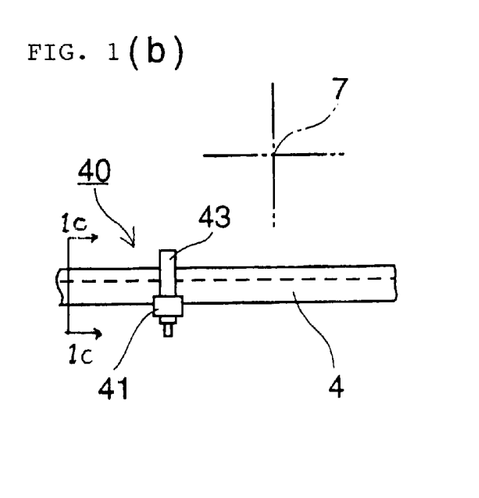
FIG. 1(b) is an enlarged plan view of the positioning sensor.
Figure 1C:
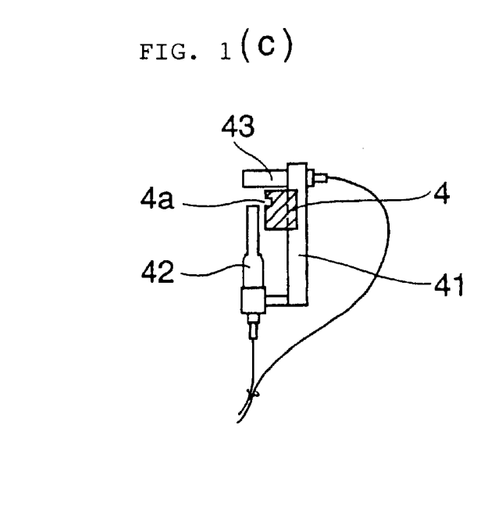
FIG. 1(c) is a sectional view taken along the line 1c—c in FIG. 1(b)

As shown in FIG. 1, a positioning sensor 40 is installed in the vicinity of the bonding position 7 so as to be toward the loader side magazine 20A. In other words, the sensor 40 is provided so as to be located between the bonding position 7 and the loader side magazine 20A. The distance from the bonding position 7 to the positioning sensor 40 is set so as to be equal to or less than the distance in which the loader side feeding claws 5 is moved in a single movement. As will be described later, this distance is obtained so that the initial bonding portion on a lead frame 1, upon which a positioning of the lead frame is executed by the positioning sensor 40, can be fed to the bonding position 7 in a single movement.

The positioning sensor 40 is formed as a unit; and in this sensor 40, a light emitter 42 and a light receiver 43 are fastened to a sensor holder 41 which is provided on the outside of one of the guide rails 4. The light emitter 42 is installed upright so as to extend upward from below, with the tip end thereof being positioned below the guide groove 4a of the corresponding guide rail 4. The light receiver 43 is installed horizontally above the guide rail 4, and the undersurface of this light receiver 43 faces the light emitter 42, thus forming a light-receiving window. The light receiver 43 is not limited to a light emission type which is describe above, and it can be a reflective type light receiver.

A basic outline of the frame feeder will be described with reference to FIG. 2.

Figures 2A, 2B, 2J:
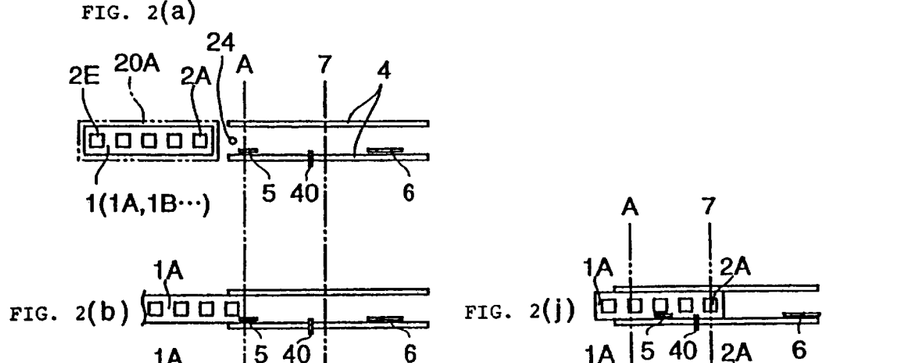
FIG. 2 is a process diagram which illustrates one embodiment of the lead frame conveying method of the present invention.

Beginning from the state shown in FIG. 2(a), the frame pusher 23 (see FIG. 3(b)), pushes out a lead frame 1A at a low speed until the lead frame 1A is detected by the photo sensor 24. In this case, the loader side feeding claws 5 are in an open state, and the position where the loader side feeding claws 5 are located at this point is called the feeding claw starting point A. When the photo sensor 24 detects the lead frame 1A, the low-speed push-out operation of the frame pusher 23 ends.

Next, the frame pusher 23 further pushes the lead frame 1A out to the position shown in FIG. 2(b), so that the lead frame 1A is chucked by the loader side feeding claws 5.

A single-pitch feeding operation which feeds the lead frame 1A one pitch at a time is next performed in an intermittent manner until the lead frame 1A reaches the vicinity of the positioning sensor 40. This process is illustrated in FIGS. 2(b) through 2(f).

More specifically, in the state shown in FIG. 2(b), the loader side feeding claws 5 close and chuck the lead frame 1A.

Figures 2C, 2D, 2E:
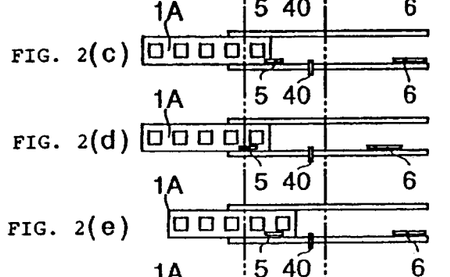

Then, the loader side feeding claws 5 perform a single-pitch feeding operation so as to feed the lead frame 1A by an amount that corresponds to a single pitch as shown in FIG. 2(c).

Then, the loader side feeding claws 5 open, return to the feeding claw starting point A as shown in FIG. 2(d), and then close to chuck the lead frame 1A.

The loader side feeding claws 5 next perform a single-pitch feeding operation so as to feed the lead frame 1A by an amount that corresponds to a single pitch as shown in FIG. 2(e).

Figures 2F, 2G, 2H, 2I:
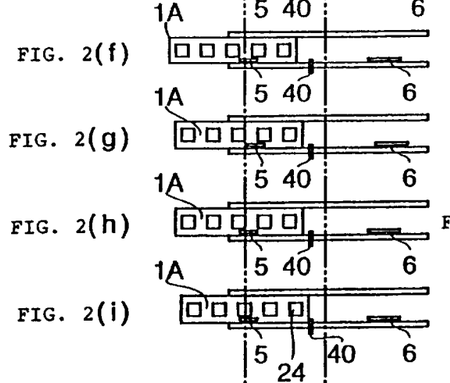

Next, the loader side feeding claws 5 open, return to the feeding claw starting point A as shown in FIG. 2(f), and then close so as to chuck the lead frame 1A.

The feeding operation is performed until the leading end (right end in FIG. 2) of the lead frame 1A reaches a position approximately 2 mm before the positioning sensor 40. If a single-pitch feeding operation is performed in the same manner as described above from the state shown in FIG. 2(f), the leading end surface of the lead frame 1A would pass the position located approximately 2 mm before the positioning sensor 40; accordingly such a single-pitch feeding operation is not performed. Instead, an operation is made so that the lead frame 1A is fed to the position located approximately 2 mm before the positioning sensor 40 as shown in FIG. 2(g).

Then, the loader side feeding claws 5 open, return to the feeding claw starting point A as shown in FIG. 2(h), and then close so as to chuck the lead frame 1A.

As shown in FIG. 2(i), a feeding operation by the loader side feeding claws 5 is next performed until the positioning sensor 40 detects the leading end of the lead frame 1A. This feeding operation is accomplished by applying pulses, for instance, two pulses, at a time to a motor (not shown) that moves the feeding claws 5, so that the loader side feeding claws 5 are moved 10 microns ($\mu$m) at a time.

Next, as shown in FIG. 2(j), a feeding operation is performed with the loader side feeding claws 5 chucking the lead frame 1A so that the first IC 2A reaches the bonding position 7. The amount of feeding in this case is an amount obtained by adding the distance between the leading end of the lead frame 1A and the center of the IC 2A to the distance between the positioning sensor 40 and the bonding position 7.

Next, after this feeding operation, the lead frame 1A is clamped by a window damper (not shown) in the same manner as in a conventional method. While being clamped by the window clamper, the bonding points on the IC 2A are detected by the television camera 13 shown in FIG. 3, and bonding is performed on the corrected bonding points by the bonding tool 15 of the bonding apparatus 10.

Figures 2K, 2L:
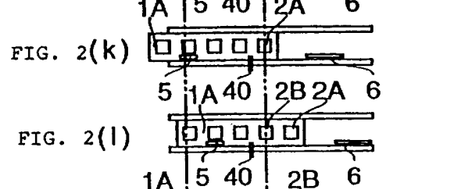

Meanwhile, the loader side feeding claws 5 return to the feeding claw starting point A as shown in FIG. 2(k) while bonding is thus being performed.

After the bonding on the IC 2A has been completed, the window damper opens, and an operation which feeds the second IC 2B to the bonding position 7 is performed by the loader side feeding claws 5. In other words, in the state shown in FIG. 2(k), the loader side feeding claws 5 close and chuck the lead frame 1A; and then, the loader side feeding claws 5 perform a feeding operation for a distance that corresponds to a single IC pitch as shown in FIG. 2(l).

Afterward, the lead frame 1A is clamped by the window damper in the same manner as described above, and bonding is performed on the IC 2B.

Figures 2M, 2N, 2O, 2P, 2Q:
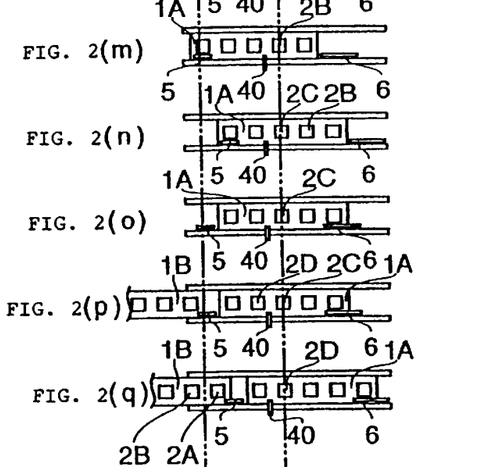

The loader side feeding claws 5 return to the feeding claw starting point A in an open state as shown in FIG. 2(m).

Then, a feeding operation the same as that for the second IC 2B is performed for the third IC 2C so that the IC 2C is fed to the bonding position 7 as shown in FIG. 2(n), and bonding is performed on the IC 2C by the same operation as described above.

Although not described above, the unloader side feeding claws 6 perform the same movements as the loader side feeding claws 5 when the loader side feeding claws 5 perform the opening, closing and reciprocating motions for the lead frame 1A.

Next, as shown in FIG. 2(o), the loader side feeding claws 5 return to the feeding claw starting point A in an open state. At this point, the trailing end (left side end in FIG. 2) of the lead frame 1A is located between the bonding position 7 and the feeding claw starting point A; and the unloader side feeding claws 6 are in an open state so as to be ready to chuck the lead frame 1A.

While bonding is being performed on the third IC 2C in FIG. 2(o), the next lead frame 1B is fed to a position which allows the lead frame 1B to be chucked by the loader side feeding claws 5 as shown in FIG. 2(p). This operation is the same as the operation shown in FIGS. 2(a) and 2(b) for the lead frame 1A.

As seen from the above, the operations shown in FIGS. 2(j) through 2(p) are the same as the operations shown in FIGS. 4(i) through 4(o); and when the bonding on the IC 2C is completed and the window damper opens, the unloader side feeding claws 6 close and chuck the lead frame 1A; and the fourth IC 2D on the lead frame 1A is fed to the bonding position 7 as shown in FIG. 2(q).

Then, the loader side feeding claws 5 close and chuck the next lead frame 1B and perform a single-pitch feeding operation. This operation of the loader side feeding claws 5 for the lead frame 1B is the same as the operation in FIGS. 2(b) through 2(j)

Thus, in the present invention, a positioning sensor 40 is installed in the vicinity of the bonding position 7 toward the loader side magazine 20A (in other words, the positioning sensor 40 is located between the loader side magazine 20A and the bonding position 7), and lead frames 1 supplied from the loader side magazine 20A are intermittently fed by the loader side feeding claws 5 of the frame feeder 3; then, the leading edges of the lead frames 1 are detected by the positioning sensor 40 and a positioning thereof is executed. In other words, the positioning of the lead frames 1 is performed by the loader side feeding claws 5 without releasing and reengaging the lead frame after being sensed by the sensor 40; accordingly, there is no wear on the loader side feeding claws 5, and lead frame positional discrepancies will not occur even if the loader side feeding claws 5 are used for a long time.

When the positioning of each lead frame 1 is completed, the loader side feeding claws 5 move while still chucking the lead frame 1(i. e., without opening), thus conveying or transferring the initial or first bonding portion (IC 2A) of the lead frame to the bonding position 7 in a single movement. In other words, after positioning of each lead frame 1 has been completed immediately before the bonding position 7, the lead frame 1 is conveyed to the bonding position in a single movement without any change in the grip by the loader side feeding claws 5. Accordingly, even if there is some discrepancy due to looseness of the loader side magazine 20A or guide rails 4 and other problems, lead frame positional discrepancy can be avoided.

Furthermore, even if some lead frame discrepancy should occur as a result of repeated gripping by the claws or deformation caused by the heat of the heater during the feeding process up to the point immediately before the bonding position 7, no feeding discrepancy will be generated.

As seen from the above, according to the present invention, the leading end of a lead frame is detected and then positioning thereof is performed using a positioning sensor which is installed in the vicinity of the bonding position toward the loader side magazine; and after this positioning has been completed, the lead frame is chucked by feeding claws, so that the initial bonding portion of the lead frame is conveyed to the bonding position. Accordingly, no wear occurs on the loader side feeding claws, and no lead frame positional discrepancies are generated even in the case of long-term use. Furthermore, even if there is some looseness of the loader side magazine or guide rails, etc., no lead frame positional discrepancy is generated; and even if some lead frame discrepancy should occur as a result of repeated gripping by the claws or deformation caused by the heat of the heater, no feeding discrepancy will be generated.

We claim:

1. A lead frame conveying method in which a lead frame supplied from a loader side magazine is chucked and conveyed by feeding claws of a frame feeder, said method comprising the steps of:

chucking said lead frame and conveying said chucked lead frame by said feeding claws to a vicinity of a bonding position;

detecting a leading end of said lead frame by means of a positioning sensor in the vacinity of the bonding position; and thereafter conveying an initial bonding portion of said chucked lead frame to said bonding position by said feeding claws without unchucking said lead frame after being detected by said positioning sensor.

2. A lead frame conveying apparatus wherein a lead frame supplied from a loader side magazine is chucked and conveyed by feeding claws of a frame feeder, said apparatus comprising:

a positioning sensor installed between said loader side magazine and a bonding position and in the vicinity of said bonding position, said positioning sensor detecting a leading end of said lead frame;

feeding claws for positioning said lead frame in the vicinity of said bonding position while said lead frame is chucked by said feeding claws; and a control means which, after a leading end of said lead frame is detected by said positioning sensor and a positioning of said lead frame is completed by said feeding claws, conveys an initial bonding portion of said lead frame to said bonding position by means of said feeding claws without unchucking said lead frame after it is detected by said positioning sensor.

3. A lead frame conveying method according to claim 1, further comprising setting a distance from said bonding position to said positioning sensor is to be equal to or less than a distance in which said feeding claws are moved in a single movement.

4. A lead frame conveying apparatus according to claim 2, wherein a distance from said bonding position to said positioning sensor is equal to or less than a distance in which said feeding claws are moved in a single movement.

5. A lead frame conveying apparatus wherein a lead frame supplied from a lead frame magazine is chucked and conveyed by feeding claws of a frame feeder, said apparatus comprising:

a positioning sensor installed between said lead frame magazine and a bonding position, said positioning sensor detecting one end of said lead frame;

feeding claws for positioning said lead frame in the vicinity of said bonding position; and a control means which transfers each one of bonding portions of said lead frame to said bonding position by means of said feeding claws without unchucking said lead frame after it is detected by said positioning sensor.

* * * * *